(12) United States Patent
Hirler et al.

(10) Patent No.: US 8,232,579 B2
(45) Date of Patent: Jul. 31, 2012

(54) SEMICONDUCTOR DEVICE AND METHOD FOR PRODUCING A SEMICONDUCTOR DEVICE

(75) Inventors: Franz Hirler, Isen (DE); Frank Dieter Pfirsch, Munich (DE)

(73) Assignee: Infineon Technologies Austria AG, Villach (AT)

( * ) Notice: Subject to any disclaimer, the term of this patent is extended or adjusted under 35 U.S.C. 154(b) by 604 days.

(21) Appl. No.: 12/402,183

(22) Filed: Mar. 11, 2009

(65) Prior Publication Data
US 2010/0230718 A1   Sep. 16, 2010

(51) Int. Cl.
*H01L 29/02* (2006.01)

(52) U.S. Cl. .................. 257/143; 257/E29.197; 438/141

(58) Field of Classification Search .................. 257/107, 257/367, 378, 423, 552, 143, 355, 659; 438/202, 438/309, 318, 322, 326, 336
See application file for complete search history.

(56) References Cited

U.S. PATENT DOCUMENTS

| | | | |
|---|---|---|---|
| 1,745,175 A | 1/1930 | Lilienfeld | |
| 4,890,143 A | 12/1989 | Baliga et al. | |
| 5,198,687 A | 3/1993 | Baliga | |
| 5,294,816 A | 3/1994 | Shekar et al. | |
| 5,324,966 A | 6/1994 | Muraoka et al. | |
| 5,412,228 A | 5/1995 | Baliga | |
| 5,488,236 A | 1/1996 | Baliga et al. | |
| 5,864,159 A | 1/1999 | Takahashi | |
| 6,111,290 A | 8/2000 | Uenishi et al. | |
| 6,392,273 B1 | 5/2002 | Chang | |
| 6,399,998 B1 | 6/2002 | Chang | |
| 6,781,199 B2 | 8/2004 | Takahashi | |
| 7,098,488 B2 | 8/2006 | Yoshikawa et al. | |
| 7,132,712 B2 | 11/2006 | Kocon et al. | |
| 7,319,257 B2 | 1/2008 | Yamaguchi et al. | |

FOREIGN PATENT DOCUMENTS

WO    9322798    11/1993

OTHER PUBLICATIONS

Constapel et al., Trench-IGBTs with Integrated Diverter Structures, International Symposium on Power Semiconductor Devices and ICs, 1995, 6 pages.

*Primary Examiner* — Matthew Landau
*Assistant Examiner* — Sonya McCall Shepard
(74) *Attorney, Agent, or Firm* — Dicke, Billig & Czaja, PLLC

(57) ABSTRACT

A semiconductor device has a first semiconductor layer of a first conductivity type and a second semiconductor layer of a second conductivity type complementary to the first conductivity type arranged in or on the first semiconductor layer. Further, the semiconductor device has a region of the first conductivity type arranged in the second semiconductor layer. A first electrode contacts the region of the first conductivity type and the second semiconductor layer. A first trench extends into the first semiconductor layer, and a voltage dependent short circuit diverter structure includes electrically conductive material arranged in the first trench and coupled to the first electrode and a highly-doped diverter region of the second conductivity type. The diverter region of the voltage dependent short circuit diverter structure has the second conductivity type and is arranged to provide a diverter channel region of the second conductivity type between the diverter region and the second semiconductor layer in the event of a short circuit.

17 Claims, 2 Drawing Sheets

SEMICONDUCTOR DEVICE AND METHOD FOR PRODUCING A SEMICONDUCTOR DEVICE

BACKGROUND

The application relates to a semiconductor device with a first semiconductor layer of a first conductivity type. The semiconductor device includes a second semiconductor layer of a second conductivity type complementary to the first conductivity type, the second semiconductor layer being arranged in or on the first semiconductor layer. This second semiconductor layer includes a region of the first conductivity type. A first electrode contacts this region of the first conductivity type and the second semiconductor layer. In addition, at least one trench extends through the second semiconductor layer into the first semiconductor layer.

Such a semiconductor device therefore has the basic structure of an IGBT (insulated gate bipolar transistor) or a MOS-FET. In the development of new generations of such semiconductor devices the on-state losses $V_{CE,\ sat}$ are to be reduced. In principle, this can be achieved by increasing the channel width while retaining the same carrier profile in the first semiconductor layer. This, however, also increases the short circuit current, so that the semiconductor device can be destroyed prematurely in a short circuit situation before a suitable gate driver can switch off the semiconductor device.

A measure for the prevention of latch-up is known wherein a diverter structure is provided in the region of the trench base, the structure being of the complementary conductivity type and doped more highly than the surrounding drift zone of the first semiconductor layer. For this purpose, the diverter structure is connected to the first electrode via a resistor. Through this connection, however, holes can leak away even in the on-state, whereby $V_{CE,\ sat}$ is increased significantly in a suitably conductive connection.

In another known method, a p-type region located on a trench side opposite the channel is connected to the emitter potential via a diode, a resistor or a MOS transistor. The EMI (electromagnetic interference) behavior can thereby be improved in the switching-on of such a semiconductor device without discharging via this p-type region of the second semiconductor layer in the on-state a hole current so high that the charge carrier flooding or the short circuit current in the on-state would be reduced significantly.

SUMMARY

An embodiment includes a semiconductor device having a first semiconductor layer of a first conductivity type and a second semiconductor layer of a second conductivity type complementary to the first conductivity type arranged in or on the first semiconductor layer. Further, the semiconductor device includes a region of the first conductivity type arranged in the second semiconductor layer. A first electrode contacts the region of the first conductivity type and the second semiconductor layer. A first trench extends into the first semiconductor layer, and a voltage dependent short circuit diverter structure includes electrically conductive material arranged in the first trench and coupled to the first electrode. A diverter region of the voltage dependent short circuit diverter structure includes the second conductivity type and is arranged to provide a diverter channel region of the second conductivity type between the diverter region and the second semiconductor layer in the event of a short circuit.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
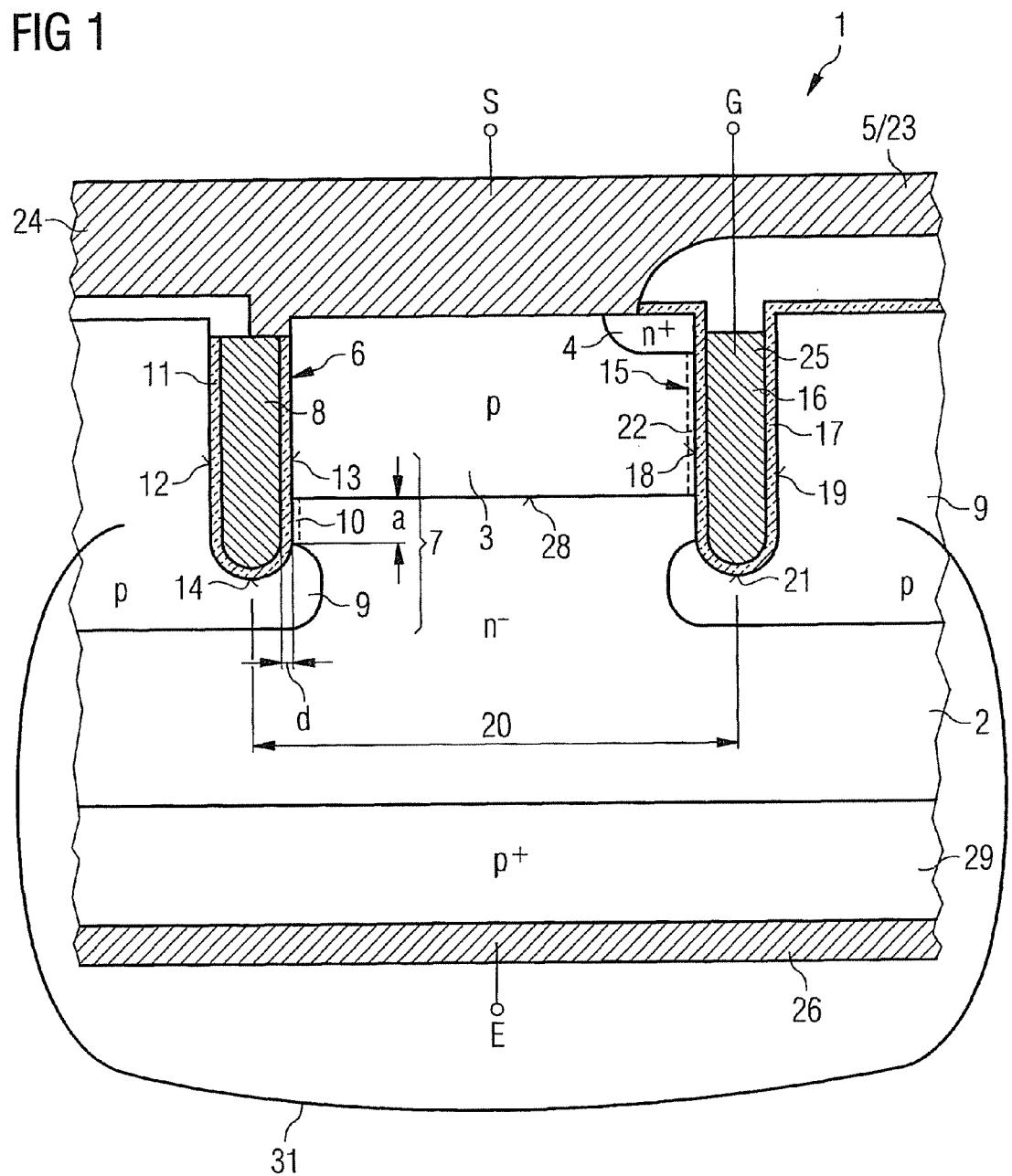
FIG. 1 illustrates a diagrammatic cross-section through a semiconductor device.

FIG. 1 illustrates a diagrammatic cross-section through a semiconductor device 1. In the illustrated embodiment, the semiconductor device 1 is an IGBT (insulated gate bipolar transistor). This embodiment includes an n-MOS-controlled semiconductor device 1 including a channel region 22 of a first conductivity type, controlled by a gate electrode 16 in a second trench 15. The gate electrode 16 includes an electrically conductive material 25. A voltage dependent short circuit diverter structure 7 includes an electrically conductive material 8 in a first trench 6 and a diverter region 9. During a short circuit, the voltage dependent short circuit diverter structure 7 provides a diverter channel 10 of a second conductivity type complementary to the first conductivity type of the channel 22 of the n-MOS-controlled semiconductor device 1

This diverter region 9 is provided in the vicinity of a p-n junction 28 from a first semiconductor layer 2 to a second semiconductor layer 3 of a substrate at a distance from 100 nanometers to a few micrometers from the p-n junction 28, enabling a p-MOS channel to form in the first semiconductor layer 2 in a short circuit situation as a diverter channel 10, the length of which corresponds to this distance. The gating of this diverter channel 10 requires the thickness d of the insulating layer 11 on the side walls 12 and 13 respectively of the first trench 6 to be selected such that the potential of a first electrode 5 to which the electrically conductive material 8 in the first trench 6 is connected is sufficient to activate the diverter channel 10 in the first semiconductor layer 2 at forward voltages of more than a few 100 mV to a few V near a base 14 of the first trench 6 such that it can be discharged via the diverter channel 10 up to, for example, a third of short circuit current. In the illustrated embodiment, the diverter region 9 extends to below the base 14 of the first trench 6. This enables the channel length of the p-MOS channel to be reduced. In addition, its transconductance is increased. In an embodiment not illustrated in the drawing, the diverter region 9 does not extend below the base 14 of the first trench 6.

In a short circuit situation, the diverter region 9 may limit the voltage applied to the n-MOS channel 22. For this purpose, the diverter region 9 surrounds a base 21 of the second trench 15 in which the gate electrode 16 is located. This enables the diverter region 9 to determine the potential at the end of the n-MOS channel 22, the diverter region 9 being not too distant from the p-n junction 28 in the region below the base 21. In a short circuit situation, the potential of the diverter region 9 in the region below the base 21 may be limited to a few volts, for example to a range of 0.2 V to 10 V, typically 0.5 V to 3 V. In conventional semiconductor devices, on the other hand, the potential rises to, for example, 20 V in this region. Owing to the lower potential, the saturation current of the first conductivity type of the n-MOS channel 22 may be limited to a lower value, thus limiting the overall load current, to which is added the current of a second conductivity type of a back side emitter 29, which is complementary to the first conductivity type. This enhances the short circuit strength of the semiconductor device 1.

The parts of the diverter region 9 illustrated in FIG. 1 form a coherent region. This is illustrated diagrammatically in FIG. 1 by a connecting line 31.

In normal on-state of the IGBT, a low voltage of less than 300 mV results near the base 14 of the first trench 6. No or only very little leakage current flows through the voltage dependent short circuit diverter structure 7. Therefore, $V_{CE, sat}$ of the IGBT is not affected. At a higher voltage of some 100 mV to a few V, on the other hand, the high current referred to above flows through the voltage dependent short circuit diverter structure 7 in the diverter channel 10.

The voltage dependent short circuit diverter structure 7 is capable of carrying high hole currents of typically ⅓ of the short circuit current. For this reason, this semi-conductor device 1 includes a voltage dependent short circuit diverter structure 7 of the p-type region either for each individual or at least for some of the n-MOS cells 20 as a diverter region 9 as illustrated in FIG. 1. It is also possible to provide one diverter channel 10 in the form of a p-MOS channel for several MOS channels 22 of the first conductivity type.

In the embodiment illustrated in FIG. 1, the voltage dependent short circuit diverter structure 7 includes a p-MOS. The gate electrode of the p-MOS is represented by the electrically conductive material 8 in the first trench 6 and is connected to the drain region of the p-MOS, which is represented by the second semiconductor layer 3. At a high drain voltage, the gate electrode of the p-MOS is driven high by increasing the potential of the diverter region 9 forming the source region of the p-MOS. The conductive material 8 in the first trench 6 may be polysilicon, amorphous silicon or other conductive or semiconductor materials which are easily integrated into the first trench 6 of a silicon semiconductor body, such as germanium, silicon carbide, zinc oxide or III-V compound semiconductors or metals such as tungsten, titanium or silicides, for example TiSi.

The drain region of the p-MOS may alternatively be a p-type region independent of the second semiconductor layer 3 and electrically connected to the first electrode 5.

The channel width of the p-MOS approximately corresponds to the channel width of the n-MOS channel 22. The channel width of the p-MOS may however be less than the channel width of the n-MOS channel 22, being more than a tenth of the channel width of the n-MOS channel 22.

In such a semiconductor device as illustrated in FIG. 1, a minimum $V_{CE, sat}$ increase is achieved combined with a noticeable reduction of short circuit current, a minimum increase of leakage current and a minimum reduction of breakdown voltage. As simulations have established, short circuit current can be reduced by two orders of magnitude. As an alternative, the channel width can be increased accordingly, whereby the forward voltage $V_{CE, sat}$ can be reduced significantly. This allows the implementation of the IGBT illustrated by way of example in FIG. 1, which, compared to a conventional IGBT, has a $V_{CE, sat}$ reduced from 1.7 V to 1.1 V while having the same short circuit and switching characteristics.

In the embodiment illustrated in FIG. 1, the first semiconductor layer 2 forms a drift zone region of a first conductivity type n, while the second semiconductor layer 3 forms base zones wherein channels 22 are formed between a region 4 of highly-doped $n^+$-type semiconductor material of the first conductivity type and the first semiconductor layer 2, if the gate electrode 16 in the second trench 15 is driven accordingly via the gate connection G. On the side walls 18 and 19 of the second trench 15, an insulating layer 17 of silicon oxide, silicon nitride or other highly effective insulating materials with a thickness d of approximately 20 nm to 200 nm (nanometers) is provided, which allows the n-channel 22 of the semiconductor device 1 to be controlled in the second semiconductor layer 3 by using the potential of the gate electrode 16 and makes it possible to cause a gating of the semiconductor device 1 between a first electrode 5 and a second electrode 26 contacting the back side emitter 29.

The back side emitter 29 is provided by a further semiconductor layer of the second conductivity type complementary to the first conductivity type. The further semiconductor layer is highly-doped and arranged below the first semiconductor layer 2.

The region 4 of highly-doped $n^+$-type semiconductor material of the first conductivity type may alternatively be arranged additionally adjacent to the first trench 6.

The insulating layers 11 and 17 may have the same thickness. Under certain doping conditions, the insulating layer 11 may be thicker than the insulating layer 17, whereby the threshold voltage of the p-MOS can be increased. Typically, however, the thickness of the insulating layer 11 is less than the thickness of the insulating layer 17, being as little as a few nanometers. As a result, the transconductance of the p-MOS can be increased.

To adjust the transconductance and the threshold voltage of the p-MOS to requirements, the electrically conductive material 8 may have a work function different from the work function of the electrically conductive material 25. The electrically conductive material 8 may for instance contain highly doped p-type polysilicon, while the electrically conductive material 25 may contain highly doped n-type polysilicon.

The gate electrode of the p-MOS, which is represented by the electrically conductive material 8, and the gate electrode 16 of the semiconductor device 1 are provided in a common trench in an embodiment not illustrated in the drawing. In this case, the two gate electrodes may for example be arranged on opposite sides of the trench, typically on opposite side walls.

The embodiment of the semiconductor device 1 illustrated in FIG. 1 is a vertical IGBT. In an embodiment not illustrated in the drawing, the semiconductor device is a lateral IGBT. Thus, the second electrode and the emitter region are arranged on the same side of the semiconductor body as the first electrode.

A method for producing a semiconductor device 1 includes the following processes. A semiconductor substrate is provided including a first semiconductor layer 2 of a first conductivity type and a second semiconductor layer 3 of a second conductivity type complementary to the first conductivity type arranged in the first semiconductor layer 2 adjoining an upper surface of the first semiconductor layer 2 or on the first semiconductor layer 2. Further, a highly-doped region 4 of the first conductivity type is produced in the second semiconductor layer 3 and a first electrode 5 is deposited to contact the region 4 of the first conductivity type and the second semiconductor layer 3. At least one first trench 6 of a cell 20 is produced and extends into the first semiconductor layer 2.

A highly-doped diverter region 9 of the second conductivity type is produced. The highly-doped diverter region 9 is arranged at a distance from the second semiconductor layer 3. Along this distance, a diverter channel region 10 of the second conductivity type between the diverter region 9 and the second semiconductor layer 3 is activated in the event of a short circuit of the semiconductor device 1. Then an insulating layer 11 is deposited on the side walls 12 and 13 and on the base 14 of the first trench 6. The thickness d of the insulating layer is selected to provide the diverter channel region 10 of the second conductivity type between the diverter region 9 and the second semiconductor layer 3 in the event of a short circuit. An electrically conductive material 8 is then deposited into the first trench 6. Further, an electrically conductive layer 24 is deposited onto the electrically conductive material 8 and onto the region 4 of the first conductivity type.

Additionally, a second trench 15 including a base 21 is produced. The highly-doped diverter region 9 of the second conductivity type is ion implanted through the base 21 of the second trench 15.

In an embodiment, the second trench 15 is processed simultaneously with the first trench 6 including a further insulating layer 17 on side walls 18 and 19 and the base 21 of the second trench 15. A gate electrode 16 of electrically conductive material 25 is deposited in the second trench 15 and an electrically conductive layer 24 as first electrode 5 is structured so that the gate electrode 16 is electrically insulated from the electrically conductive layer 24. The electrically conductive layer 24 provides a load electrode 23 which is electrically connected to the electrically conductive material 8 of the first trench 6 and to the highly-doped region 4 of the first conductivity type as well as to the second layer 3 of the second conductivity type.

The highly-doped diverter region 9 may additionally surround the base 14 of the first trench 6.

To adjust the transconductance and the threshold voltage of the p-MOS to requirements, the concentration of doping material in the region of the p-MOS can be adjusted by using a slight p- or n-type implantation, for example in the base 14, and by out-diffusion.

Figure 2:
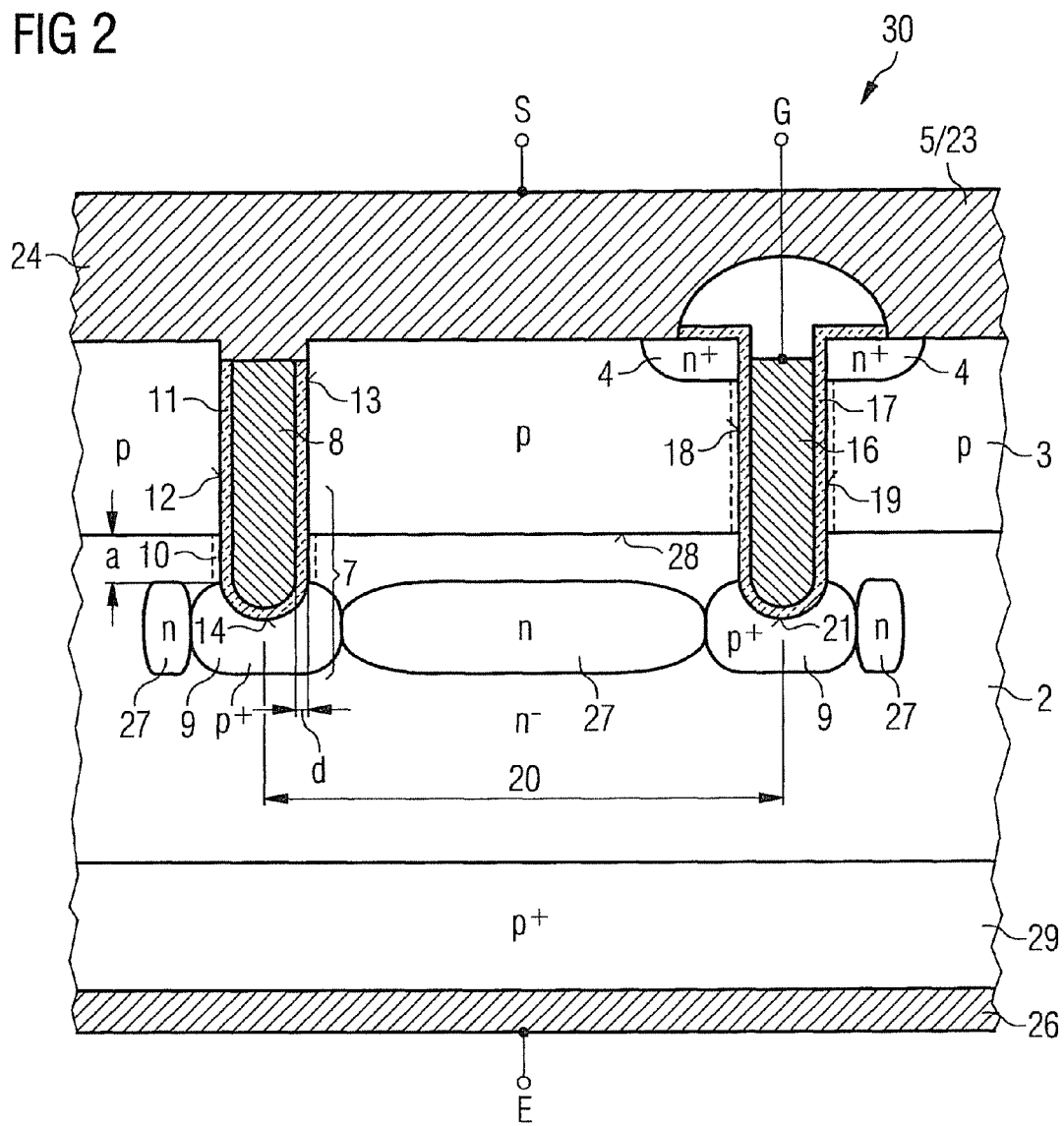
FIG. 2 illustrates a diagrammatic cross-section through a semiconductor device.

FIG. 2 illustrates a diagrammatic cross-section through a semiconductor device 30. Components of the same function as in FIG. 1 are identified by the same reference numbers and not explained again. In this embodiment, diverter regions 9 limited to the base regions of a trench 6 or 15 respectively and surrounding the base 14 or 21 respectively at a distance a from the second semiconductor layer 3 are provided under all trenches 6 and 15 of a cell field of which only one cell 20 is illustrated in cross-section.

Between the limited diverter regions 9, some embodiments include doped buried layers 27 of the first conductivity type in the drift region of the first semiconductor layer 2, which are doped more highly than the surrounding drift region. These buried layers 27 with an increased concentration of doping material between the diverter regions 9 reduce any pinch effects on the electron flow through the limited diverter regions 9. In a third dimension not illustrated in the drawing, the diverter regions 9 are connected to one another.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a first semiconductor layer of a first conductivity type;
a second semiconductor layer of a second conductivity type complementary to the first conductivity type arranged in or on the first semiconductor layer;
a region of the first conductivity type arranged in the second semiconductor layer;
a first electrode contacting the region of the first conductivity type and the second semiconductor layer;
a first trench extending into the first semiconductor layer;
a second trench extending into the first semiconductor layer;
a gate electrode arranged in the second trench;
a further insulating layer extending along side walls and along a base of the second trench, wherein the further insulating layer includes a thickness higher than a thickness of an insulating layer extending along side walls of the first trench; and
a voltage dependent short circuit diverter structure including electrically conductive material arranged in the first trench and coupled to the first electrode and a diverter region of the second conductivity type arranged to provide a diverter channel region of the second conductivity type between the diverter region and the second semiconductor layer in the event of a short circuit.

2. The semiconductor device of claim 1, wherein the diverter region is floating.

3. The semiconductor device of claim 1, comprising a further semiconductor layer of the second conductivity type complementary to the first conductivity type arranged below the first semiconductor layer.

4. The semiconductor device of claim 1, wherein an insulating layer extends along side walls of the first trench and along a base of the first trench.

5. The semiconductor device of claim 1, wherein a gate electrode is arranged in the first trench.

6. The semiconductor device of claim 1, wherein the diverter region at least partially surrounds a base of the second trench and wherein the diverter region is at least partially arranged adjacent the first trench.

7. The semiconductor device of claim 1, wherein the gate electrode includes highly doped polysilicon of the first conductivity type and the electrically conductive material includes highly doped polysilicon of the second conductivity type.

8. The semiconductor device of claim 1, further comprising a plurality of cells, each cell including a voltage dependent short circuit structure.

9. The semiconductor device of claim 5, wherein the gate electrode and the electrically conductive material are arranged at opposite sides of the first trench.

10. The semiconductor device of claim 1, wherein the semiconductor device provides a MOS-controlled semiconductor device including a channel region of the first conductivity type.

11. The semiconductor device of claim 1, wherein the semiconductor device provides an insulated gate bipolar transistor.

12. The semiconductor device of claim 10, wherein a width of the diverter channel region of the second conductivity type is essentially equal to a width of the channel region of the first conductivity type.

13. The semiconductor device of claim 10, wherein a width of the diverter channel region of the second conductivity type is greater than one tenth of a width of the channel region of the first conductivity type.

14. A semiconductor device, comprising:
a first semiconductor layer of a first conductivity type;
a second semiconductor layer of a second conductivity type complementary to the first conductivity type arranged in or on the first semiconductor layer;
a region of the first conductivity type arranged in the second semiconductor layer;
a first electrode contacting the region of the first conductivity type and the second semiconductor layer;
a first trench extending into the first semiconductor layer;
a second trench extending into the first semiconductor layer;
a further insulating layer extending along side walls and along a base of the second trench, wherein the further insulating layer includes a thickness higher than a thickness of an insulating layer extending along side walls of the first trench; and
a voltage dependent short circuit diverter structure including electrically conductive material arranged in the first trench and coupled to the first electrode and a diverter region of the second conductivity type arranged to provide a diverter channel region of the second conductivity type between the diverter region and the second semiconductor layer in the event of a short circuit, wherein the diverter region at least partially surrounds the base of the second trench and wherein the diverter region is at least partially arranged adjacent the first trench.

15. The semiconductor device of claim 14, comprising a further semiconductor layer of the second conductivity type complementary to the first conductivity type arranged below the first semiconductor layer.

16. A semiconductor device comprising:
a MOS-controlled semiconductor device including a channel of a first conductivity type and a voltage dependent short circuit diverter structure including electrically conductive material arranged in a first trench and a diverter region arranged surrounding a base of a second trench,
wherein during a short circuit, the voltage dependent short circuit diverter structure provides a diverter channel of a second conductivity type complementary to the first conductivity type; and
wherein an insulating layer extends along side walls and along the base of the second trench, wherein the insulating layer includes a thickness higher than a thickness of an insulating layer extending along side walls of the first trench.

17. The semiconductor device of claim 16, wherein the electrically conductive material arranged in the first trench is electrically connected to a load electrode of the MOS-controlled semiconductor device.

* * * * *